(12) United States Patent
Li et al.

(10) Patent No.: US 10,770,667 B2
(45) Date of Patent: Sep. 8, 2020

(54) FLEXIBLE DISPLAY DEVICE AND MANUFACTURING METHOD THEREOF

(71) Applicant: Wuhan China Star Optoelectronics Semiconductor Display Technology Co., Ltd., Wuhan (CN)

(72) Inventors: Shasha Li, Wuhan (CN); Shoucheng Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 22 days.

(21) Appl. No.: 16/308,823

(22) PCT Filed: Sep. 20, 2018

(86) PCT No.: PCT/CN2018/106751
§ 371 (c)(1),
(2) Date: Dec. 11, 2018

(87) PCT Pub. No.: WO2020/037757
PCT Pub. Date: Feb. 27, 2020

(65) Prior Publication Data
US 2020/0067000 A1    Feb. 27, 2020

(30) Foreign Application Priority Data
Aug. 21, 2018    (CN) .......................... 2018 1 0951165

(51) Int. Cl.
*H01L 27/32*    (2006.01)
*H01L 51/00*    (2006.01)
(Continued)

(52) U.S. Cl.
CPC ...... *H01L 51/0097* (2013.01); *H01L 27/3244* (2013.01); *H05K 1/0281* (2013.01);
(Continued)

(58) Field of Classification Search
CPC ......... H01L 51/0097; H01L 2251/5338; H01L 27/3244–3297; H01L 51/5253;
(Continued)

(56) References Cited

U.S. PATENT DOCUMENTS

| 9,911,798 B2 | 3/2018 | Eo | |
|---|---|---|---|
| 2013/0148312 A1* | 6/2013 | Han | H05K 7/00 361/736 |

(Continued)

FOREIGN PATENT DOCUMENTS

| CN | 105826350 | 8/2016 |
|---|---|---|
| CN | 108022942 | 5/2018 |

*Primary Examiner* — Eric A. Ward

(57) ABSTRACT

A flexible display device is provided, including: a display area, a bending area, and a driving printed circuit board. The bending area is located between the display area and the driving printed circuit board, and the driving printed circuit board is located on a rear side of the display area by bending of the bending area. The bending area includes: a substrate; an inorganic layer disposed on the substrate, where the inorganic layer is disposed on the substrate and distributed in a form of islands, and the inorganic layer includes a plurality of island-shaped blocks, and two adjacent island-shaped blocks are spaced apart from each other; and a first metal layer disposed on a whole surface of the inorganic layer and the substrate, where the first metal layer forms a plurality of first recesses corresponding to shapes of the plurality of island-shaped blocks.

13 Claims, 9 Drawing Sheets

(51) Int. Cl.
*H05K 1/02* (2006.01)
*H05K 3/46* (2006.01)
*H05K 1/03* (2006.01)

(52) U.S. Cl.
CPC ......... *H05K 1/0393* (2013.01); *H05K 3/4691* (2013.01); *H01L 2251/5338* (2013.01)

(58) Field of Classification Search
CPC ............. H01L 27/3258; H01L 27/3276; H01L 2227/323; H01L 2251/5392; H05K 1/0281; H05K 1/0393; H05K 3/4691; G09F 9/301
See application file for complete search history.

(56) References Cited

U.S. PATENT DOCUMENTS

| | | | |
|---|---|---|---|
| 2014/0097408 A1 | 4/2014 | Kim et al. | |
| 2016/0218305 A1* | 7/2016 | Kim | G02F 1/133305 |
| 2017/0110526 A1* | 4/2017 | Eo | H01L 51/5253 |
| 2017/0170206 A1* | 6/2017 | Lee | H01L 51/52 |
| 2017/0288007 A1* | 10/2017 | Shin | H01L 51/56 |
| 2018/0166019 A1* | 6/2018 | Lee | H01L 27/3276 |
| 2019/0081257 A1* | 3/2019 | Kim | H01L 51/0097 |

* cited by examiner

FLEXIBLE DISPLAY DEVICE AND MANUFACTURING METHOD THEREOF

RELATED APPLICATIONS

This application is a National Phase of PCT Patent Application No. PCT/CN2018/106751 having International filing date of Sep. 20, 2018, which claims the benefit of priority of Chinese Patent Application No. 201810951165.5 filed on Aug. 21, 2018. The contents of the above applications are all incorporated by reference as if fully set forth herein in their entirety.

FIELD AND BACKGROUND OF THE INVENTION

The present disclosure relates to the field of display devices, and more particularly to a flexible display device and a manufacturing method thereof.

Flexible organic light emitting diode (OLED) displays have many advantages over conventional liquid crystal displays, such as bendability, active illumination, high contrast, light weight, and fast response times, etc. Therefore, in recent years, OLED technology has received more and more attention, and people have higher and higher requirements for OLED displays performance, such as technologies for narrow borders and full screens.

Generally, the OLED display mainly includes a display area, a fan-out area, a bending area, a driving printed circuit board (e.g., a flexible printed circuit, FPC), etc. The bending area is used to connect metal wires in the peripheral fan-out area and the driving printed circuit board, so that the driving printed circuit board can be located on the rear side of the display area by bending of the bending area. A bending performance of the bending area not only affects signal transmission of the driving printed circuit board but also directly determines size of a lower frame of the display. This is also a key technology to realize the narrow frame and the full screen.

Referring to FIG. 1, which shows a cross-sectional view of a flexible display device 10 of the prior art, where only a display area 11 and a bending area 12 of the flexible display device 10 are shown, and the rest are omitted. The flexible display device 10 includes a substrate 101, a buffer layer 102, a gate insulating layer 103, a dielectric layer 104, a thin film transistor (TFT) channel 105, a gate 106, an organic layer 107, a metal layer 108, an organic planarization layer 109, a pixel electrode 110, a pixel definition layer 111, and an organic light emitting layer 112. The flexible display device 10 includes a plurality of organic film layers, such as the buffer layer 102, the gate insulating layer 103, and the dielectric layer 104. The above organic film layers are basically made from an organic material, such as silicon nitride, silicon oxide or the like. Characteristics of the inorganic material are relatively brittle and not resistant to bending stress, so it is easy to crack under external force. In order to ensure that the flexible display device 10 can be flexed successfully, the inorganic film layers in the bending area 12 are removed, and an organic material layer (i.e., the organic layer 107) is filled, thereby causing the existing flexible display device 10 has a drawback of high manufacturing cost.

Accordingly, it is necessary to provide a flexible display device and a manufacturing method thereof to solve the technical problems in the prior art.

SUMMARY OF THE INVENTION

In order to solve technical problems mentioned above, an object of the present disclosure is to provide a flexible display device and a manufacturing method thereof, where by modifying a design of the bending area of the flexible display device, the bending performance of the bending area is improved, and usage amount of the organic material in the bending area is reduced, so that an additional step for forming the organic layer can be omitted, thereby saving manufacturing costs.

In order to achieve the objects described above, the present disclosure provides a flexible display device, including: a display area, a bending area, and a driving printed circuit board, where the bending area is located between the display area and the driving printed circuit board, and the driving printed circuit board is located on a rear side of the display area by bending of the bending area, and the bending area includes: a substrate; an inorganic layer disposed on the substrate, where the inorganic layer is disposed on the substrate and distributed in a form of islands, and the inorganic layer includes a plurality of island-shaped blocks, and two adjacent island-shaped blocks are spaced apart from each other; a first metal layer disposed on a whole surface of the inorganic layer and the substrate, where the first metal layer forms a plurality of first recesses corresponding to shapes of the plurality of island-shaped blocks; and an organic planarization layer disposed on the first metal layer, where the organic planarization layer covers the first metal layer and fills the plurality of first recesses; and where distances between the plurality of island-shaped blocks are different, and a distance between two adjacent island-shaped blocks located in a center of the bending area is greater than a distance between two adjacent island-shaped blocks located on both sides of the bending area.

The present disclosure also provides a flexible display device, including: a display area, a bending area, and a driving printed circuit board, where the bending area is located between the display area and the driving printed circuit board, and the driving printed circuit board is located on a rear side of the display area by bending of the bending area, and the bending area includes: a substrate; an inorganic layer disposed on the substrate, where the inorganic layer is disposed on the substrate and distributed in a form of islands, and the inorganic layer includes a plurality of island-shaped blocks, and two adjacent island-shaped blocks are spaced apart from each other; and a first metal layer disposed on a whole surface of the inorganic layer and the substrate, where the first metal layer forms a plurality of first recesses corresponding to shapes of the plurality of island-shaped blocks.

In one preferred embodiment of the present disclosure, distances between the plurality of island-shaped blocks are different, and a distance between two adjacent island-shaped blocks located in a center of the bending area is greater than a distance between two adjacent island-shaped blocks located on both sides of the bending area.

In one preferred embodiment of the present disclosure, a material of the first metal layer in the bending area is the same as a material of a source/drain region in the display area.

In one preferred embodiment of the present disclosure, the bending area of the flexible display device further includes an organic planarization layer disposed on the first metal layer, and the organic planarization layer covers the first metal layer and fills the plurality of first recesses.

In one preferred embodiment of the present disclosure, the bending area of the flexible display device further includes a second metal layer disposed between the first metal layer and the substrate; and where the second metal layer is formed from a plurality of patterning units, and the plurality of patterning units are spaced apart from each other, and one of the patterning units is located between two adjacent island-shaped blocks.

In one preferred embodiment of the present disclosure, a material of the second metal layer in the bending area is the same as a material of a gate in the display area.

In one preferred embodiment of the present disclosure, the bending area of the flexible display device further includes an organic layer disposed on the first metal layer, and the organic layer fills the plurality of first recesses.

In one preferred embodiment of the present disclosure, a material of the first metal layer in the bending area is the same as a material of a gate in the display area.

In one preferred embodiment of the present disclosure, the bending area of the flexible display device further includes a patterning dielectric layer disposed on the first metal layer and the organic layer, and the patterning dielectric layer is formed at a position corresponding to the plurality of island-shaped blocks of the inorganic layer.

In one preferred embodiment of the present disclosure, the bending area of the flexible display device further includes a second metal layer, and the second metal layer is disposed on a whole surface of the patterning dielectric layer and the organic layer, and the second metal layer forms a plurality of second recesses corresponding to a shape of the patterning dielectric layer.

In one preferred embodiment of the present disclosure, the bending area of the flexible display device further includes an organic planarization layer disposed on the second metal layer, and the organic planarization layer convers the second metal layer and fills the plurality of second recesses.

The present disclosure also provides a manufacturing method of a flexible display device, where a display area, a bending area, and a driving printed circuit board are defined within the flexible display device, the bending area is located between the display area and the driving printed circuit board, and the driving printed circuit board is located on a rear side of the display area by bending of the bending area, and the manufacturing method includes: providing a substrate; disposing an inorganic layer on the substrate; patterning the inorganic layer, where in the bending area the inorganic layer is disposed on the substrate and distributed in a form of islands, and the inorganic layer includes a plurality of island-shaped blocks, and two adjacent island-shaped blocks are spaced apart from each other; and disposing the first metal layer on the inorganic layer, where in the bending area the first metal layer forms a plurality of first recesses corresponding to shapes of the plurality of island-shaped blocks.

In one preferred embodiment of the present disclosure, distances between the plurality of island-shaped blocks are different, and a distance between two adjacent island-shaped blocks located in a center of the bending area is greater than a distance between two adjacent island-shaped blocks located on both sides of the bending area.

In one preferred embodiment of the present disclosure, in the step of disposing the first metal layer on the inorganic layer, a source/drain region in the display area is simultaneously formed.

In one preferred embodiment of the present disclosure, after the step of disposing the first metal layer on the inorganic layer, the method further including: disposing an organic planarization layer on the first metal layer, where the organic planarization layer covers the first metal layer and fills the plurality of first recesses.

In one preferred embodiment of the present disclosure, before disposing the first metal layer, the method further including: disposing a second metal layer on the inorganic layer; patterning the second metal layer, such that the second metal layer includes a plurality of patterning units, and the plurality of patterning units are spaced apart from each other, and one of the patterning units is located between two adjacent island-shaped blocks.

In one preferred embodiment of the present disclosure, in the step of disposing the second metal layer on the inorganic layer and the step of patterning the second metal layer, a gate in the display area is simultaneously formed.

In one preferred embodiment of the present disclosure, after the step of disposing the first metal layer on the inorganic layer, the method further including: disposing an organic layer on the first metal layer, where the organic layer fills the plurality of the first recesses; and where in the step of disposing the first metal layer on the inorganic layer, a gate in the display area is simultaneously formed.

In one preferred embodiment of the present disclosure, after disposing the organic layer on the first metal layer, the method further including: disposing a patterning dielectric layer on the first metal layer and the organic layer, where the patterning dielectric layer is formed at a position corresponding to the plurality of island-shaped blocks of the organic layer; disposing a second metal layer on a whole surface of the patterning dielectric layer and the organic layer, where the second metal layer forms a plurality of second recesses corresponding to a shape of the patterning dielectric layer; and disposing an organic planarization layer on the second metal layer, where the organic planarization layer covers the second metal layer and fills the plurality of second recesses.

In comparison to prior art, in the bending area of the flexible display device of the present disclosure, the inorganic layer is disposed on the substrate and distributed in a form of islands, and the inorganic layer defines a plurality of island-shaped blocks. Moreover, the corresponding separation distance of the plurality of island-shaped blocks can be adjusted according to the bending degree of different regions in the bending area. Thus, the center of the bending area can be bent at a large angle with respect to both sides, so that the size of a lower frame of the flexible display device can be effectively shortened. Furthermore, by designing the inorganic layer to be distributed in a form of islands and extending the metal layer to cover the inorganic layer of the bending area, an overall bending performance can be improved and the stress generated during the bending can be alleviated, and the metal layer can be prevented from breaking. On the other hand, the present disclosure reduces usage amount of organic material used in the bending area by designing the inorganic layer to be distributed in a form of islands and filling the recesses of the metal layer with the organic planarization layer. Therefore, an additional step of forming an organic layer in the prior art can be omitted, thereby saving manufacturing costs.

DESCRIPTION OF SPECIFIC EMBODIMENTS OF THE INVENTION

The structure and the technical means adopted by the present disclosure to achieve the above and other objects can be best understood by referring to the following detailed description of the preferred embodiments and the accompanying drawings.

Figure 2:
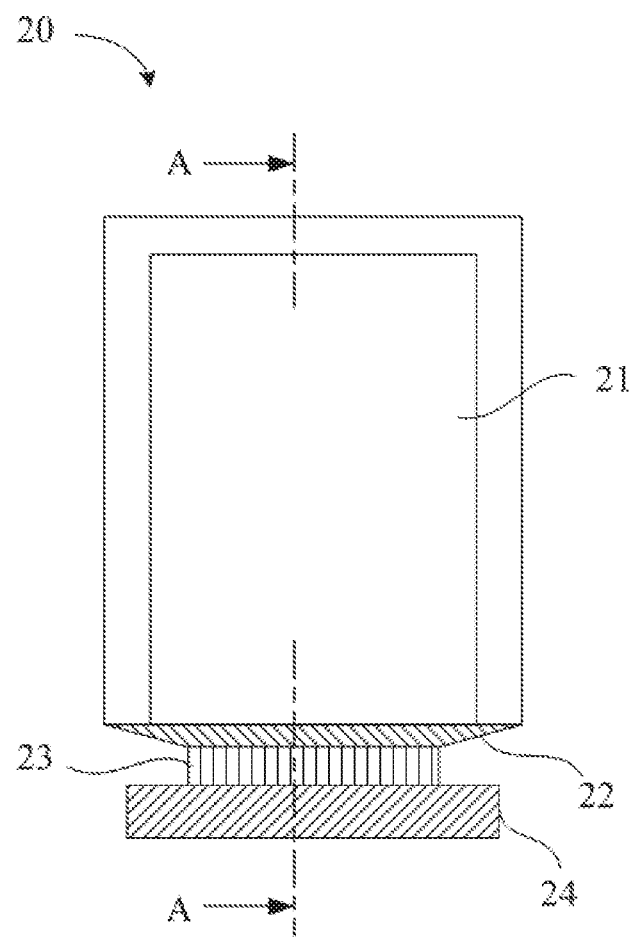
FIG. 2 shows a schematic diagram of a flexible display device according to a first preferred embodiment of the present disclosure.
Figure 3:
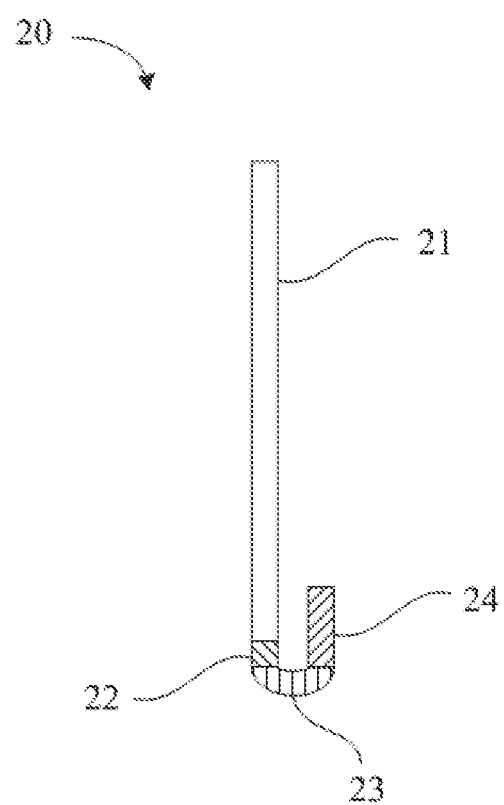
FIG. 3 is a schematic diagram showing the flexible display device of FIG. 2 after being bent.

Referring to FIG. 2 and FIG. 3, FIG. 2 shows a schematic diagram of a flexible display device 20 according to a first preferred embodiment of the present disclosure, and FIG. 3 is a schematic diagram showing the flexible display device 20 of FIG. 2 after being bent. The flexible display device 20 may be a flexible organic light-emitting device (FOLED). The flexible display device 20 includes a display area 21, a fan-out area 22, a bending area 23, a driving printed circuit board (e.g., a flexible printed circuit, FPC) 24, and the like. The display area 21 is provided with a plurality of pixel units (including a thin film transistor (TFT) and an organic light emitting unit (OLED), etc.) for displaying a picture. The fan-out area 22 is provided with a plurality of wires for signal transmission between the display area 21 and the driving printed circuit board 24. The bending area 23 is configured for connecting the plurality of wires of the fan-out area 22 with the driving printed circuit board 24. As shown in FIG. 3, by the bending characteristic of the bending area 23, the driving printed circuit board 24 can be placed on a rear side of the display area 21.

Figure 4:
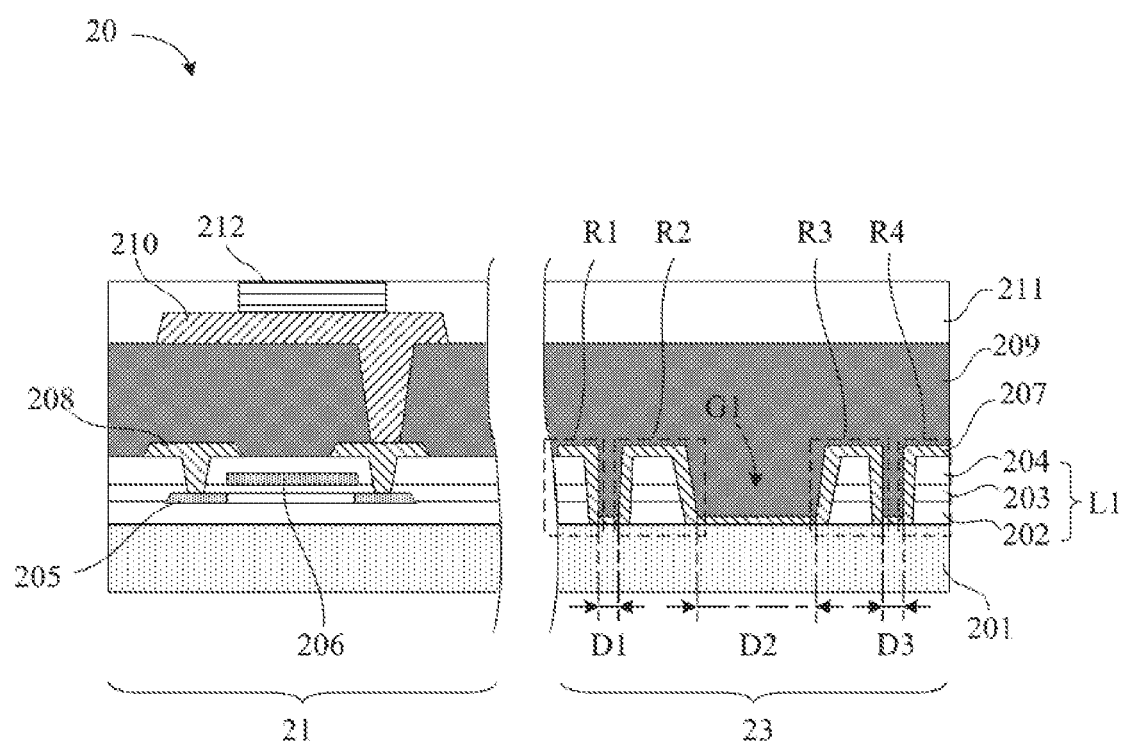
FIG. 4 shows a cross-sectional view along a line A-A of FIG. 2.

Referring to FIG. 4, which shows a cross-sectional view along a line A-A of FIG. 2, where only the display area 21 and the bending area 23 of the flexible display device 20 are shown, and the rest are omitted. The flexible display device 20 includes a substrate 201, a buffer layer 202, a gate insulating layer 203, a dielectric layer 204, a TFT channel 205, a gate 206, a first metal layer 207, a source/drain region 208, an organic planarization layer 209, a pixel electrode 210, a pixel definition layer 211, and an organic light emitting layer 212. The buffer layer 202, the gate insulating layer 203, and the dielectric layer 204 of the flexible display device 20 are all made from an inorganic material (for example, silicon nitride, silicon oxide, etc.), and an inorganic layer L1 is used as a substitute for the three-layer structure. Furthermore, the gate 206, the first metal layer 207, the source/drain region 208, and the pixel electrode 210 are made of a conductive material such as molybdenum, aluminum, indium tin oxide or the like. In addition, the organic planarization layer 209 and the pixel definition layer 211 are made of an organic material which has good elasticity and easy deformation characteristics.

Figure 5:
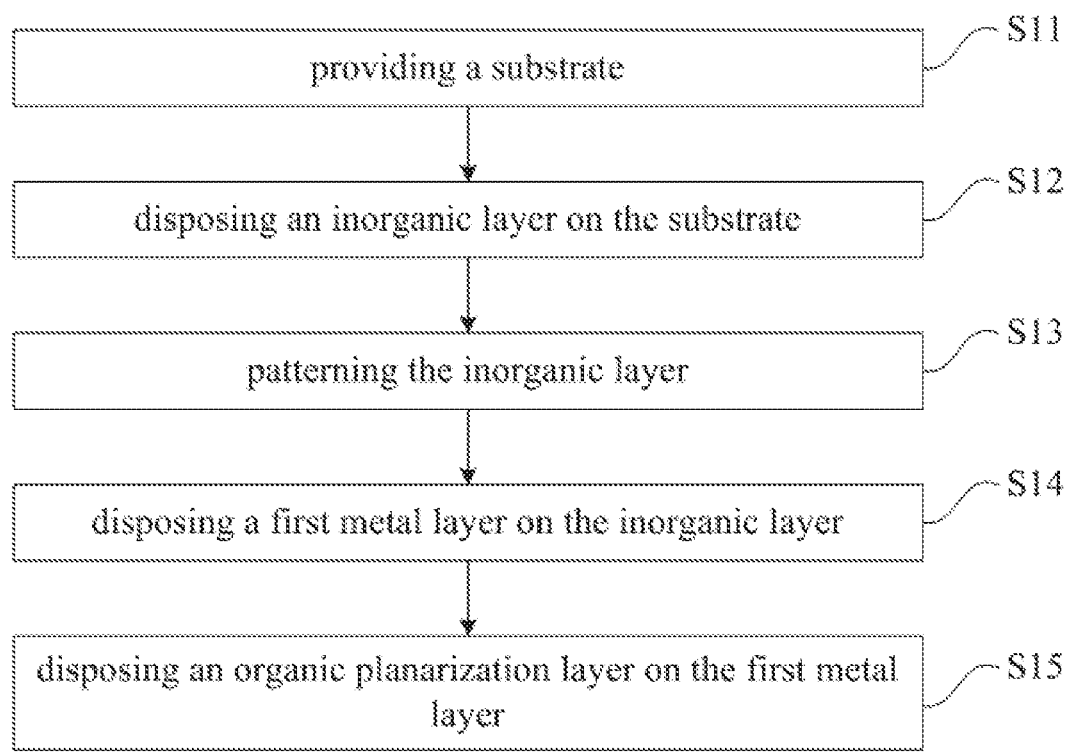
FIG. 5 is a flowchart showing a manufacturing method of the flexible display device of FIG. 2.

Referring to FIG. 4 and FIG. 5, FIG. 5 is a flowchart showing a manufacturing method of the flexible display device 20 of FIG. 2. The manufacturing method of the flexible display device 20 includes the following steps. First, in step S11, a substrate 201 is provided, where the substrate 201 may be made of glass or a flexible material.

Next, in step S12, a buffer layer 202, a gate insulating layer 203, and a dielectric layer 204 are sequentially disposed on the substrate 201 to form an inorganic layer L1. As shown in FIG. 4, before forming the dielectric layer 204, the gate 206 is formed on the gate insulating layer 203 by a photolithography process, where the gate 206 is located in the display area 21.

Next, in step S13, the inorganic layer L1 is patterned. In the bending area 23, the inorganic layer L1 is disposed on the substrate 201 and distributed in a form of islands, and the inorganic layer L1 includes a plurality of island-shaped blocks, such as an island-shaped block R1, an island-shaped block R2, an island-shaped block R3, an island-shaped block R4, and the like. Two adjacent island-shaped blocks are spaced apart from each other. As shown in NG. 4, two adjacent the island-shaped block R1 and the island-shaped block R2 are spaced apart from each other by a distance D1, and two adjacent the island-shaped block R2 and the island-shaped block R3 are spaced apart from each other by a distance D2, and two adjacent the island-shaped block R3 and the island-shaped block R4 are spaced apart from each other by a distance D3. It should be noted that the corresponding separation distances of island-shaped blocks R1, R2, R3, and R4 are adjusted according to the bending degree of different regions in the bending area 23. For example, the distances D1, D2, and D3 between the island-shaped blocks R1, R2, R3, and R4 are different, and the distance D2 between the adjacent the island-shaped block R2 and the island-shaped block R3 in the center of the bending area 23 is greater than the distance D1 between the adjacent the island-shaped block R1 and the island-shaped block R2 in one side of the bending area, and is also greater than the distance D3 between the adjacent the island-shaped block R3 and the island-shaped block R4 in the other side of the bending area. With this design, the center of the bending area 23 can be bent at a large angle with respect to both sides, so that the size of a lower frame of the flexible display device 20 can be effectively shortened. On the other hand, in the step of patterning the inorganic layer L1, a plurality of through holes are formed in the display area 21 to provide the disposition of the source/drain region 208 of the TFT.

Next, in step S14, the first metal layer 207 is disposed on the inorganic layer L1. As shown in FIG. 4, in the step of disposing the first metal layer 207 on the inorganic layer L1, the source/drain region 208 in the display area 21 is simultaneously formed. That is, the first metal layer 207 of the bending area 23 and the source/drain region 208 of the display area 21 are formed by the same process, so that the materials of the both are the same. In the bending area 23, the first metal layer 207 is disposed on a whole surface of the inorganic layer L1 and the substrate 201, so that the first metal layer 207 forms a plurality of first recesses G1 corresponding to shapes of the island-shaped blocks R1, R2, R3, and R4. In the present disclosure, the inorganic layer L1 is distributed in a form of islands, and the first metal layer 207 extends to cover the inorganic layer L1 of the bending area 23. Therefore, it can increase an overall bending performance and relieve the stress generated during the bending, and the first metal layer 207 can be prevented from breaking.

Figure 1:
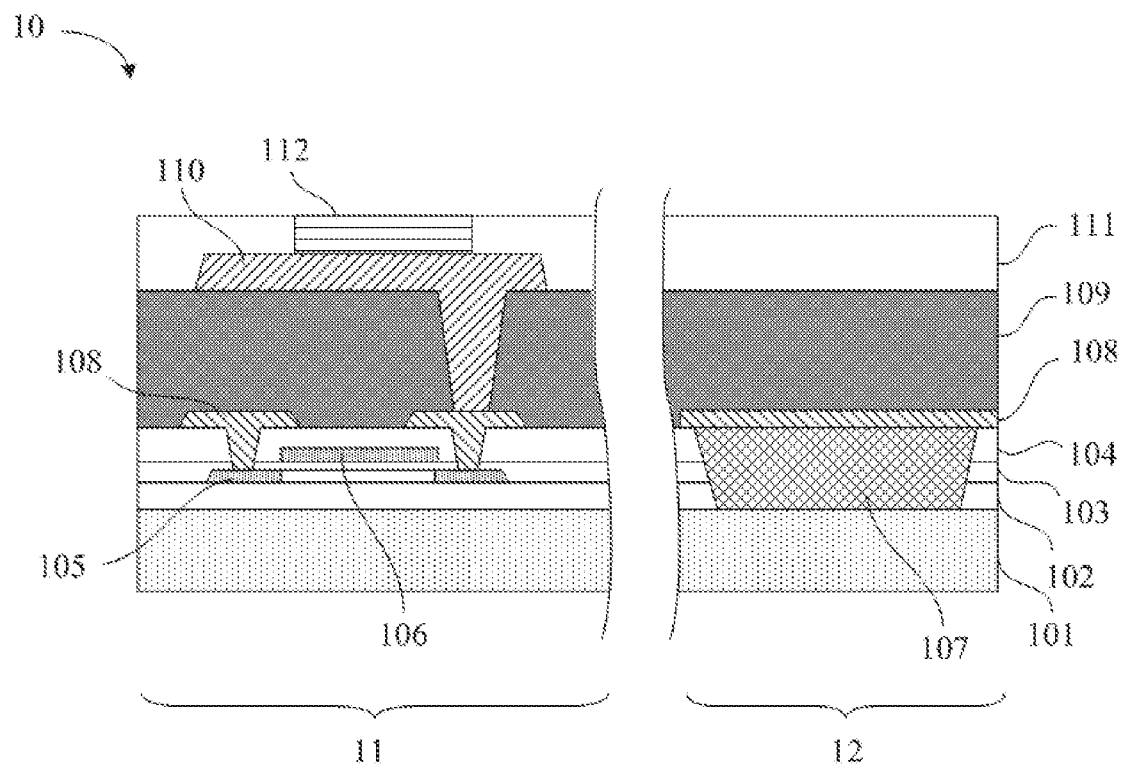
FIG. 1 shows a schematic diagram of a flexible display device of the prior art.

Next, in step S15, the organic planarization layer 209 is disposed on the first metal layer 207. In the bending area 23, the organic planarization layer 209 covers the first metal layer 207 and fills a plurality of first recesses G1. In the present disclosure, the inorganic layer L1 is designed to be distributed in a form of islands, and the first recess G1 is filled with the organic planarization layer 209, so that an additional steps of forming an organic layer (e.g., the organic layer 107 of FIG. 1) in the prior art can be omitted. Furthermore, the usage amount of the organic material of the bending area 23 is reduced, thereby saving manufacturing costs. Finally, the pixel electrode 210, the pixel definition layer 211, and the organic light emitting layer 212 are sequentially formed on the organic planarization layer 209 by exposing, etching, etc., thereby accomplishing manufacture of the flexible display device 20, where the pixel electrode 210 and the organic light emitting layer 212 only exist in the display area 21.

Figure 6:
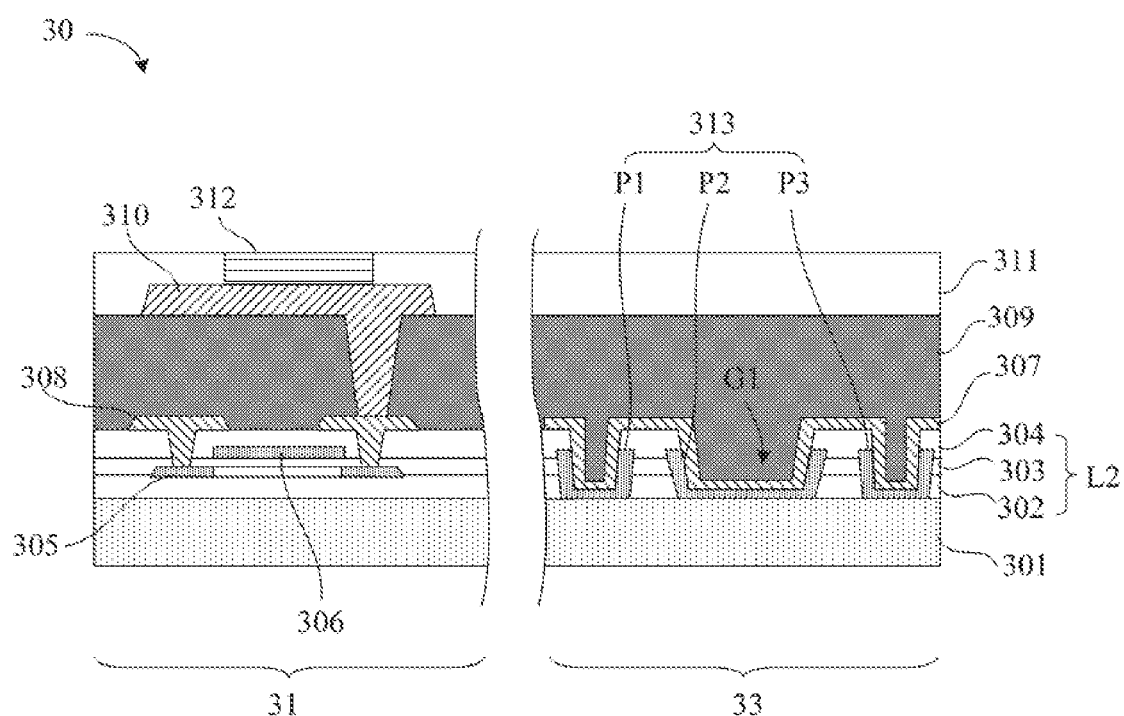
FIG. 6 shows a schematic diagram of a flexible display device according to a second preferred embodiment of the present disclosure.

Referring to FIG. 6, which shows a schematic diagram of a flexible display device 30 according to a second preferred embodiment of the present disclosure, where only a display area 31 and a bending area 33 of the flexible display device 30 are shown, and the rest are omitted. The flexible display device 30 includes a substrate 301, a buffer layer 302, a gate insulating layer 303, a dielectric layer 304, a TFT channel 305, a gate 306, a first metal layer 307, a source/drain region 308, an organic planarization layer 309, a pixel electrode 310, a pixel definition layer 311, an organic light emitting layer 312, and a second metal layer 313. The buffer layer 302, the gate insulating layer 303, and the dielectric layer 304 of the flexible display device 30 are all made from an inorganic material (for example, silicon nitride, silicon oxide, etc.), and an inorganic layer L2 is used as a substitute for the three-layer structure. Furthermore, the gate 306, the first metal layer 307, the source/drain region 308, the pixel electrode 310, and the second metal layer 313 are made of a conductive material such as molybdenum, aluminum, indium tin oxide or the like. In addition, the organic planarization layer 309 and the pixel definition layer 311 are made of an organic material which has good elasticity and easy deformation characteristics.

Figure 7:
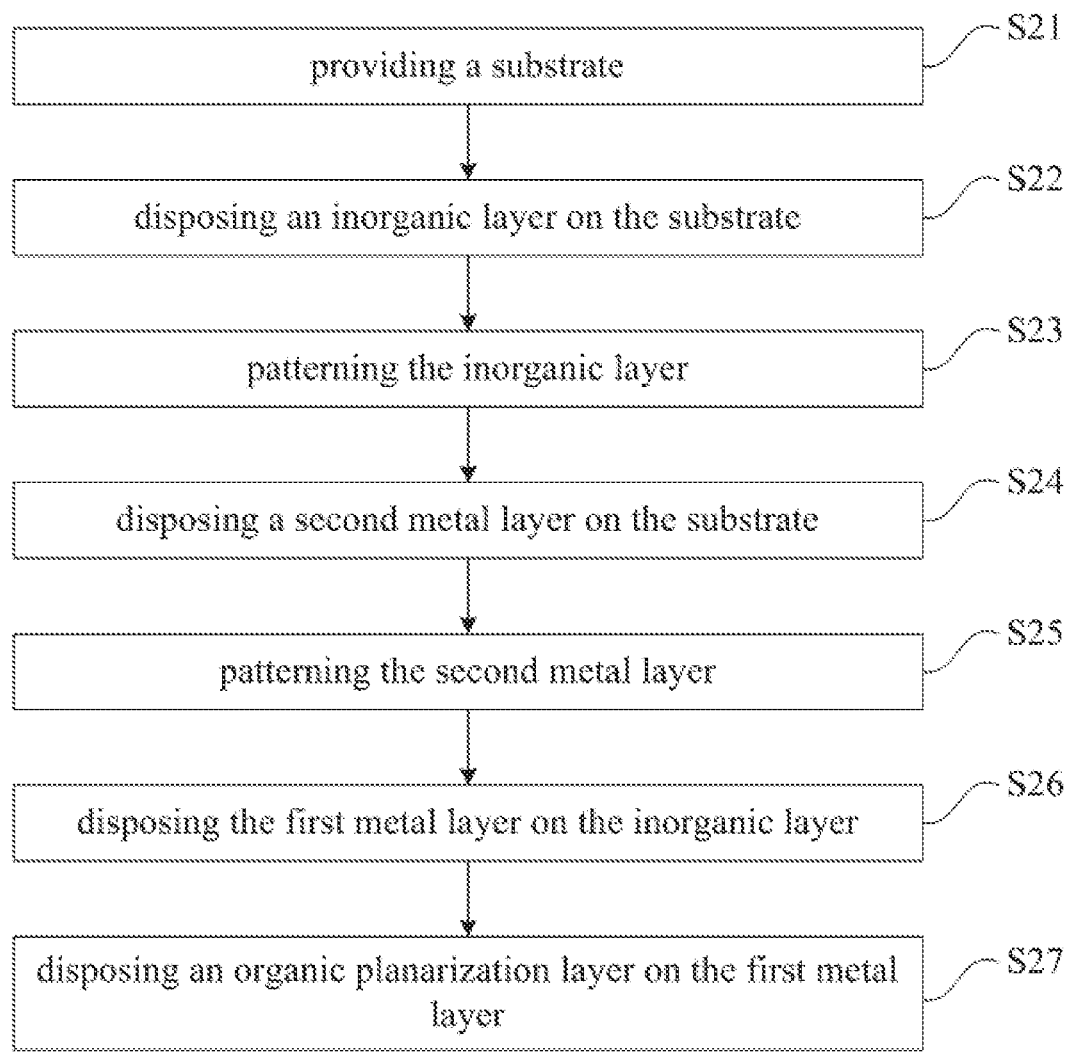
FIG. 7 is a flowchart showing a manufacturing method of the flexible display device of FIG. 6.

Referring to FIG. 6 and FIG. 7, FIG. 7 is a flowchart showing a manufacturing method of the flexible display device 30 of FIG. 6. The manufacturing method of the flexible display device 30 includes the following steps. First, in step S21, a substrate 301 is provided, where the substrate 301 may be made of glass or a flexible material. Next, in step S22, the buffer layer 302 and the gate insulating layer 303 of the inorganic layer L2 are disposed on the substrate 301.

Next, in step S23, the buffer layer 302 and the gate insulating layer 303 of the inorganic layer L2 are patterned. As shown in FIG. 6, in the bending area 33, the inorganic layer L2 is distributed in a form of islands on the substrate 301, and the inorganic layer L2 includes a plurality of island-shaped blocks. Two adjacent island-shaped blocks are spaced apart from each other. It should be noted that the corresponding separation distance of the plurality of island-shaped blocks can be adjusted according to the bending degree of different regions in the bending area 33. For example, the distance between two island-shaped blocks is different, and the distance between two adjacent island-shaped blocks located in the center of the bending area 33 is greater than the distance between two adjacent island-shaped blocks located on both sides of the bending area 33. With this design, the center of the bending area 33 can be bent at a large angle with respect to both sides, so that the size of a lower frame of the flexible display device 30 can be effectively shortened.

Next, in step S24, the second metal layer 313 is disposed on the buffer layer 302 and the gate insulating layer 303 of the inorganic layer L2. Next, in step S25, the second metal layer 313 is patterned such that the second metal layer 313 includes a plurality of patterning units P1, P2, P3, and the plurality of patterning units P1, P2, P3 are spaced apart from each other. One of the patterning units P1, P2, P3 is between two adjacent island-shaped blocks. Preferably, in the step of disposing the second metal layer 313 on the buffer layer 302 and the gate insulating layer 303 of the inorganic layer L2 and in the step of patterning the second metal layer 313, the gate 306 in the display area 31 is simultaneously formed. That is, the second metal layer 313 in the bending area 33 and the gate 306 in the display area 31 are formed by the same process, so that the materials of the two are the same. After patterning the second metal layer 313, a patterned dielectric layer 304 is disposed on the second metal layer 313 to form the inorganic layer L2. The patterned dielectric layer 304 is formed at a position corresponding to a plurality of island-shaped blocks of the inorganic layer L2. On the other hand, in the step of patterning the inorganic layer L2, a plurality of through holes are formed in the display area 31 to provide the disposition of the source/drain region 308 of the TFT.

Next, in step S26, the first metal layer 307 is disposed on the inorganic layer L2. As shown in FIG. 6, in the step of disposing the first metal layer 307 on the inorganic layer L3, the source/drain region 308 in the display area 31 is simultaneously formed. That is, the first metal layer 307 in the bending area 33 and the source/drain region 308 in the display area 31 are formed by the same process, so that the materials of the two are the same. In the bending area 33, the first metal layer 307 is disposed on a whole surface of the inorganic layer L2 and the second metal layer 313, so that the first metal layer 307 forms a plurality of first recesses G1 corresponding to shapes of the island-shaped blocks. In the present disclosure, by designing the inorganic layer L2 to be in a form of islands and extending the first metal layer 307 to cover the inorganic layer L2 of the bending area 33. Therefore, it can increase an overall bending performance and relieve the stress generated during the bending, and the first metal layer 307 can be prevented from breaking. Furthermore, by providing the second metal layer 313 between the first metal layer 307 and the substrate 301 in the bending area 33, the first metal layer 307 can be prevented from being broken at the position of the first recess G1 causes the signal transmission of the driving printed circuit board to be interrupted, thereby increasing service life of the flexible display device 30.

Next, in step S27, the organic planarization layer 309 is disposed on the first metal layer 307. In the bending area 33, the organic planarization layer 309 covers the first metal layer 307 and fills the plurality of first recesses G1. In the present disclosure, the inorganic layer L2 is designed to be distributed in a form of islands, and the first recesses G1 are filled with the organic planarization layer 309, so that an additional step of forming an organic layer (e.g., the organic layer 107 of FIG. 1) in the prior art can be omitted. Furthermore, the usage amount of the organic material in the bending area 33 is reduced, thereby saving manufacturing costs. Finally, the pixel electrode 310, the pixel definition layer 311, and the organic light emitting layer 312 are sequentially formed on the organic planarization layer 309 by exposing, etching, etc., thereby accomplishing the manufacture of the flexible display device 30, where the pixel electrode 310 and the organic light emitting layer 312 will only exist in display area 31.

Figure 8:
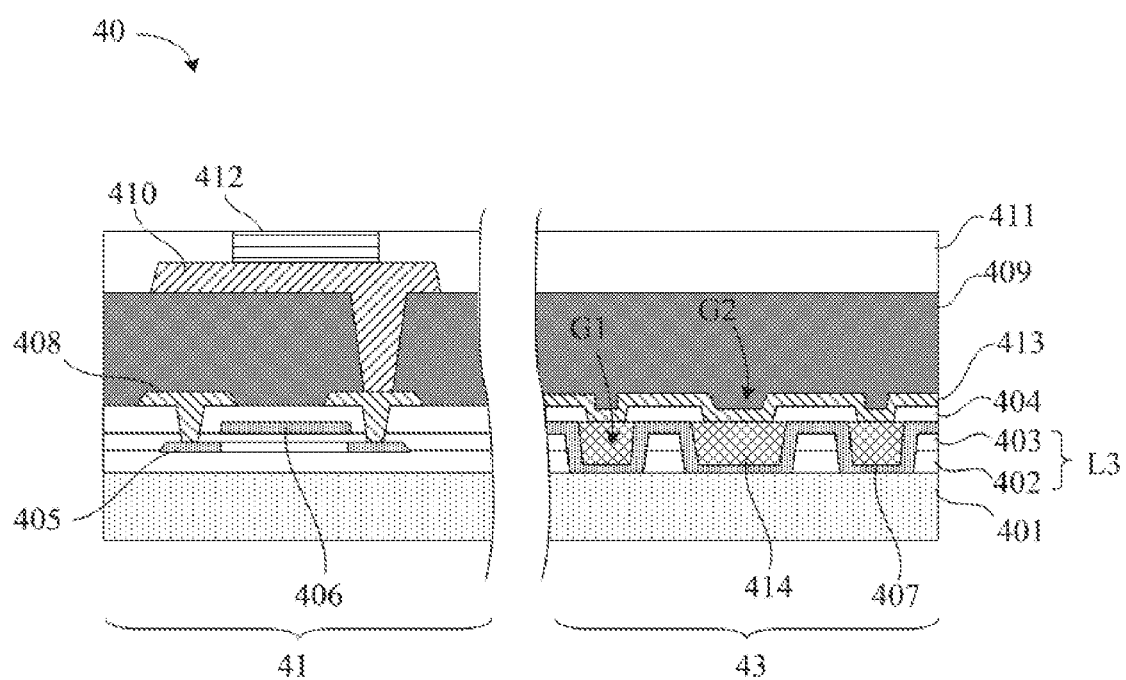
FIG. 8 shows a schematic diagram of a flexible display device according to a third preferred embodiment of the present disclosure.

Referring to FIG. 8, which shows a schematic diagram of a flexible display device 40 according to a third preferred embodiment of the present disclosure, where only a display area 41 and a bending area 43 of the flexible display device 40 are shown, and the rest are omitted. The flexible display device 40 includes a substrate 401, a buffer layer 402, a gate insulating layer 403, a patterning dielectric layer 404, a TFT channel 405, a gate 406, a first metal layer 407, a source/drain region 408, an organic planarization layer 409, a pixel electrode 410, a pixel definition layer 411, an organic light emitting layer 412, a second metal layer 413, and an organic layer 414. The buffer layer 402, the gate insulating layer 403, and the patterning dielectric layer 404 of the flexible display device 40 are all made from an inorganic material (for example, silicon nitride, silicon oxide, etc.). In this embodiment, an inorganic layer L3 is used as a substitute for the two-layer structure (i.e., the buffer layer 402 and the gate insulating layer 403). Furthermore, the gate 406, the first metal layer 407, the source/drain region 408, the pixel electrode 410, and the second metal layer 413 are made of a conductive material such as molybdenum, aluminum, indium tin oxide or the like. In addition, the organic planarization layer 409, the pixel definition layer 411, and the organic layer 414 are made of an organic material which has characteristics of good elasticity and easy deformation.

Figure 9:
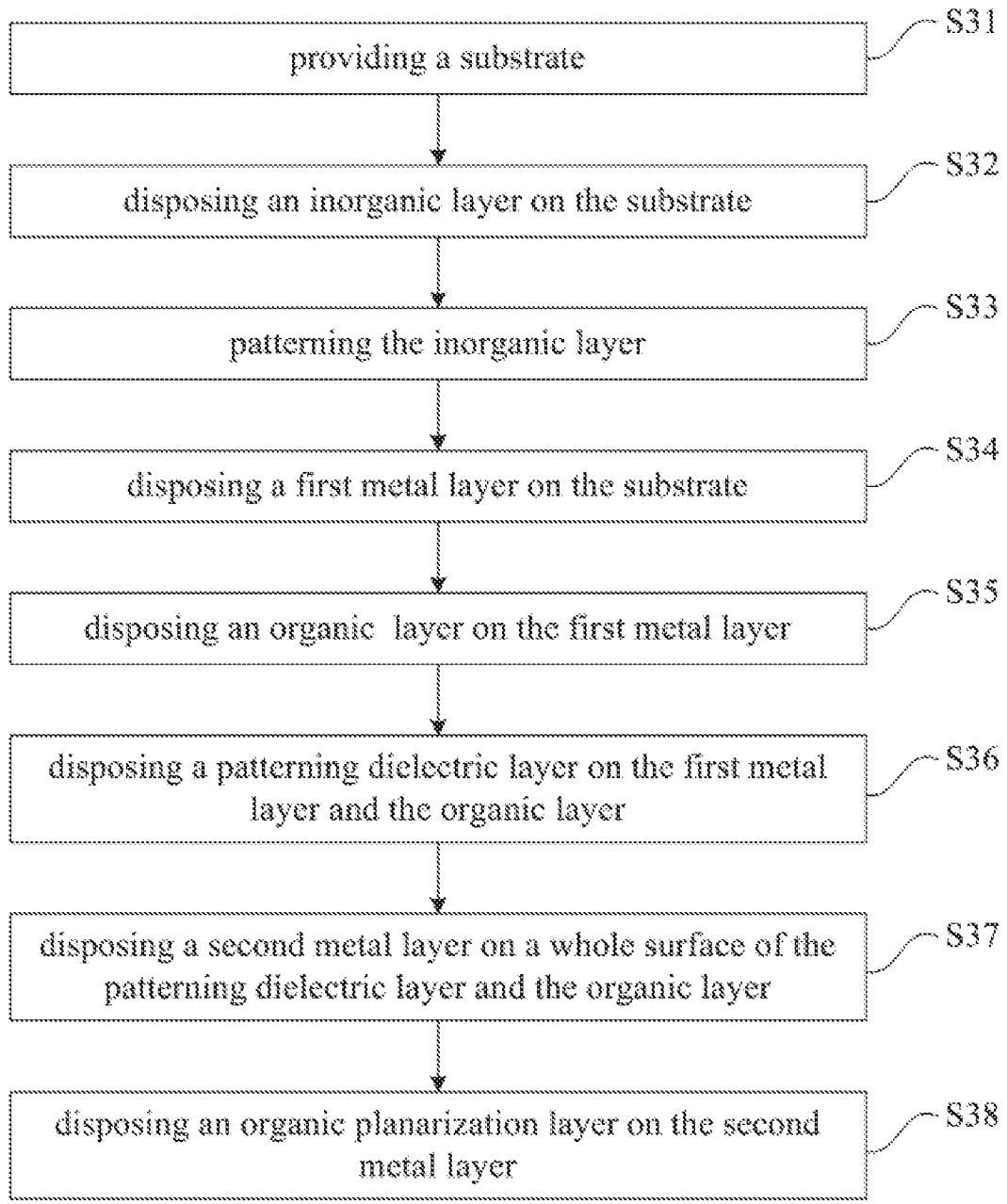
FIG. 9 is a flowchart showing a manufacturing method of the flexible display device of FIG. 8.

Referring to FIG. 8 and FIG. 9, FIG. 9 is a flowchart showing a manufacturing method of the flexible display device 40 of FIG. 8. The manufacturing method of the flexible display device 80 includes the following steps. First, in step S31, a substrate 401 is provided, where the substrate 401 may be made of glass or a flexible material. Next, in step S32, the buffer layer 402 and the gate insulating layer 403 are sequentially disposed on the substrate 401 to form the inorganic layer L3.

Next, in step S33, the inorganic layer L3 is patterned. In the bending area 43, the inorganic layer L3 is distributed in a form of islands on the substrate 401, and the inorganic layer L3 includes a plurality of island-shaped blocks. Two adjacent island-shaped blocks are spaced apart from each other. It should be noted that the corresponding separation distance of the plurality of island-shaped blocks can be adjusted according to the bending degree of different regions in the bending area 43. For example, the distance between two island-shaped blocks is different, and the distance between two adjacent island-shaped blocks located in the center of the bending area 43 is greater than the distance between two adjacent island-shaped blocks located on both sides of the bending area 43. With this design, the center of the bending area 43 can be bent at a large angle with respect to both sides, so that the size of a lower frame of the flexible display device 40 can be effectively shortened.

Next, in step S34, the first metal layer 407 is disposed on the inorganic layer L3. As shown in FIG. 8, in the step of disposing the first metal layer 407 on the inorganic layer L3, the gate 406 in the display area 41 is simultaneously formed. That is, the first metal layer 407 in the bending area 43 and the gate 406 in the display area 41 are formed by the same process, so that the materials of the two are the same. In the bending area 43, the first metal layer 407 is disposed on a whole surface of the inorganic layer L3 and the substrate 401, so that the first metal layer 407 forms a plurality of first recesses G1 corresponding to shapes of the island-shaped blocks. In the present disclosure, by designing the inorganic layer L3 to be in a form of islands and extending the first metal layer 407 to cover the inorganic layer L3 of the bending area 43. Therefore, it can increase an overall bending performance and relieve the stress generated during the bending, and the first metal layer 407 can be prevented from breaking.

Next, in step S35, the organic layer 414 is disposed on the first metal layer 407. The organic layer 414 fills a plurality of first recesses G1 formed by the first metal layer 407, and a surface of the organic layer 414 and a surface of the first metal layer 407 are on the same plane. Next, in step S36, the patterning dielectric layer 404 is disposed on the first metal layer 407 and the organic layer 414. The patterning dielectric layer 404 is formed at a position corresponding to a plurality of island-shaped blocks of the inorganic layer L3. On the other hand, in the step of forming the patterning dielectric layer 404, a plurality of through holes are formed in the display area 41 to provide the disposition of the source/drain region 408 of the TFT.

Next, in step S37, the second metal layer 413 is disposed on a whole surface of the patterning dielectric layer 404 and the organic layer 414. The second metal layer 413 forms a plurality of second recesses G2 corresponding to a shape of the patterning dielectric layer 404. In this embodiment, by providing the organic layer 414 and the patterning dielectric layer 404, the first metal layer 407 and the second metal layer 413 can be electrically isolated to avoid electrical contact between the two to cause a short circuit. Moreover, since the first metal layer 407 and the second metal layer 413 are two independent traces, different signals can be transmitted according to requirements, thereby increasing space utilization.

Next, in step S38, the organic planarization layer 409 is disposed on the second metal layer 413, where the organic planarization layer 409 covers the second metal layer 413 and fills the plurality of second recesses G2. In the present disclosure, the patterning dielectric layer 404 is designed to be distributed in a form of islands, and the second recesses G2 are filled with the organic planarization layer 409. In comparison to prior art, the usage amount of the organic material in the bending area 43 is reduced, thereby saving manufacturing costs. Finally, the pixel electrode 410, the pixel definition layer 411, and the organic light emitting layer 412 are sequentially formed on the organic planarization layer 409 by exposing, etching, etc., thereby accomplishing the manufacture of the flexible display device 40, where the pixel electrode 410 and the organic light emitting layer 412 will only exist in display area 41.

In summary, in the bending area of the flexible display device of the present disclosure, the inorganic layer is disposed on the substrate and distributed in a form of islands, and the inorganic layer defines a plurality of island-shaped blocks. Moreover, the corresponding separation distance of the plurality of island-shaped blocks can be adjusted according to the bending degree of different regions in the bending area. Thus, the center of the bending area can be bent at a large angle with respect to both sides, so that the size of a lower frame of the flexible display device can be effectively shortened. Furthermore, by designing the inorganic layer to be distributed in a form of islands and extending the metal layer to cover the inorganic layer of the bending area, an overall bending performance can be improved and the stress generated during the bending can be alleviated, and the metal layer can be prevented from breaking. On the other hand, the present disclosure reduces usage amount of organic material used in the bending area by designing the inorganic layer to be distributed in a form of islands and filling the recesses of the metal layer with the organic planarization layer. Therefore, an additional step of forming an organic layer in the prior art can be omitted, thereby saving manufacturing costs.

The above descriptions are merely preferable embodiments of the present disclosure. Any modification or replacement made by those skilled in the art without departing from the principle of the present disclosure should fall within the protection scope of the present disclosure.

What is claimed is:

1. A flexible display device, comprising: a display area, a bending area, and a driving printed circuit board, wherein the bending area is located between the display area and the driving printed circuit board, and the driving printed circuit board is located on a rear side of the display area by bending of the bending area, and the bending area comprises:
   a substrate;
   an inorganic layer disposed on the substrate, wherein the inorganic layer is disposed on the substrate and distributed in a form of islands, and the inorganic layer comprises a plurality of island-shaped blocks, and two adjacent island-shaped blocks are spaced apart from each other;
   a first metal layer disposed over a whole surface of the inorganic layer and the substrate, wherein the first metal layer forms a plurality of first recesses corresponding to shapes of the plurality of island-shaped blocks; and
   a second metal layer disposed between the first metal layer and the substrate; and wherein the second metal layer is formed from a plurality of patterning units, and the plurality, of patterning units are spaced apart from each other, and one of the patterning units is located between two adjacent island-shaped blocks.

2. The flexible display device as claimed in claim 1, wherein distances between the plurality of island-shaped blocks are different, and a distance between two adjacent island-shaped blocks located in a center of the bending area is greater than a distance between two adjacent island-shaped blocks located on both sides of the bending area.

3. The flexible display device as claimed in claim 1, wherein a material of the first metal layer in the bending area is the same as a material of a source/drain region in the display area.

4. The flexible display device as claimed in claim 1, wherein the bending area of the flexible display device further comprises an organic planarization layer disposed on the first metal layer, and the organic planarization layer covers the first metal layer and fills the plurality of first recesses.

5. The flexible display device as claimed in claim 1, wherein a material of the second metal layer in the bending area is the same as a material of a gate in the display area.

6. A flexible display device, comprising: a display area, a bending area, and a driving printed circuit board, wherein the bending area is located between the display area and the driving printed circuit board, and the driving printed circuit board is located on a rear side of the display area by bending of the bending area, and the bending area comprises:
   a substrate;
   an inorganic layer disposed on substrate, wherein the inorganic layer is disposed on the substrate and distributed in a form of islands, and the inorganic layer comprises a plurality of island-shaped blocks, and two adjacent island-shaped blocks are spaced apart from each other;
   a first metal layer disposed on a whole surface of the inorganic layer and the substrate, wherein the first metal layer forms a plurality of first recesses corresponding to shapes of the plurality of island-shaped blocks;
   an organic disposed on the first metal layer, and the organic layer fills the plurality of first recesses; and
   a patterning dielectric layer disposed on the first metal layer and the organic layer, and the patterning dielectric layer is formed at a position corresponding to the plurality of island-shaped blocks of the inorganic layer.

7. The flexible display device as claimed in claim 6, wherein the bending area of the flexible display device further comprises a second metal layer, and the second metal layer is disposed on a whole surface of the patterning dielectric layer and the organic layer, and the second metal layer forms a plurality of second recesses corresponding to a shape of the patterning dielectric layer.

8. The flexible display device as claimed in claim 7, wherein the bending area of the flexible display device further comprises an organic planarization layer disposed on the second metal layer, and the organic planarization layer convers the second metal layer and fills the plurality of second recesses.

9. A manufacturing method of a flexible display device, wherein a display area, a bending area, and a driving printed circuit board are defined within the flexible display device, the bending area is located between the display area and the driving printed circuit board, and the driving printed circuit board is located on a rear side of the display area by bending of the bending area, and the manufacturing method comprises:
   providing a substrate;
   disposing an inorganic layer on the substrate;
   patterning the inorganic layer, wherein in the bending area the inorganic layer is disposed on the substrate and distributed in a form of islands, and the inorganic layer comprises a plurality of island-shaped blocks, and two adjacent island-shaped blocks are spaced apart from each other;
   disposing a second metal layer on the inorganic layer;
   patterning the second metal layer, such that the second metal layer comprises a plurality of patterning units, and the plurality of patterning units are spaced apart from each other, and one of the patterning units is located between two adjacent island-shaped blocks; and
   disposing a first metal layer on the inorganic layer and the second metal layer, wherein in the bending area the first metal layer forms a plurality of first recesses corresponding to shapes of the plurality of island-shaped blocks.

10. The manufacturing method of the flexible display device as claimed in claim 9, wherein distances between the plurality of island-shaped blocks are different, and a distance between two adjacent island-shaped blocks located in a center of the bending area is greater than a distance between two adjacent island-shaped blocks located on both sides of the bending area.

11. The manufacturing method of the flexible display device as claimed in claim 9, wherein in the step of disposing the first metal layer on the inorganic layer, a source/drain region in the display area is simultaneously formed.

12. The manufacturing method of the flexible display device as claimed in claim 9, wherein after the step of disposing the first metal layer on the inorganic layer, the method further comprising:
   disposing an organic planarization layer on the first metal layer, wherein the organic planarization layer covers the first metal layer and fills the plurality of the first recesses.

13. The manufacturing method of the flexible display device as claimed in claim 9, wherein in the step of disposing the second metal layer on the inorganic layer and the step of patterning the second metal layer, a gate in the display area is simultaneously formed.

\* \* \* \* \*